United States Patent
Jo et al.

(10) Patent No.: US 7,384,900 B2
(45) Date of Patent: Jun. 10, 2008

(54) COMPOSITION AND METHOD FOR REMOVING COPPER-COMPATIBLE RESIST

(75) Inventors: Gyoo-Chul Jo, Gyeonggi-do (KR); Gee-Sung Chae, Incheon (KR); Oh-Nam Kwon, Gyeonggi-do (KR); Kyoung-Mook Lee, Seoul (KR); Yong-Sup Hwang, Gyeonggi-do (KR); Seong-Bae Kim, Seoul (KR); Suk-Chang Jang, Choongcheongnam-do (KR); Suk-Il Yoon, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 396 days.

(21) Appl. No.: 10/924,841

(22) Filed: Aug. 25, 2004

(65) Prior Publication Data

US 2005/0048397 A1    Mar. 3, 2005

(30) Foreign Application Priority Data

Aug. 27, 2003   (KR) ............... 10-2003-0059628
Sep. 17, 2003   (KR) ............... 10-2003-0064547

(51) Int. Cl.
   *C11D 7/50*   (2006.01)
(52) U.S. Cl. ..................... 510/175; 134/1.3
(58) Field of Classification Search ............ None
   See application file for complete search history.

(56) References Cited

U.S. PATENT DOCUMENTS

| | | | | |
|---|---|---|---|---|
| 5,308,745 | A * | 5/1994 | Schwartzkopf | 430/329 |
| 5,795,702 | A * | 8/1998 | Tanabe et al. | 430/331 |
| 6,218,087 | B1 * | 4/2001 | Tanabe et al. | 430/331 |
| 6,524,376 | B2 * | 2/2003 | Aoki et al. | 106/14.42 |
| 6,773,873 | B2 * | 8/2004 | Seijo et al. | 430/329 |
| 2001/0014534 | A1 * | 8/2001 | Aoki et al. | 438/689 |
| 2001/0021489 | A1 * | 9/2001 | Wakiya et al. | 430/329 |
| 2001/0034313 | A1 * | 10/2001 | Honda et al. | 510/176 |
| 2003/0130146 | A1 * | 7/2003 | Egbe et al. | 510/175 |
| 2003/0181344 | A1 * | 9/2003 | Ikemoto et al. | 510/175 |
| 2005/0176259 | A1 * | 8/2005 | Yokoi et al. | 438/745 |

FOREIGN PATENT DOCUMENTS

| | | |
|---|---|---|
| JP | 06-061615 | 3/1994 |
| JP | 06-266119 | 9/1994 |
| JP | 2000-199971 | 7/2000 |
| JP | 2001-350276 | 12/2001 |
| JP | 2002-072505 | 3/2002 |
| JP | 2003-076037 | 3/2003 |
| WO | WO 01/14934 | 3/2001 |

* cited by examiner

*Primary Examiner*—Gregory E Webb
(74) *Attorney, Agent, or Firm*—McKenna Long & Aldridge LLP

(57) ABSTRACT

A composition for removing a copper-compatible resist includes about 10 to 30% by weight of an amine compound solvent, the amine compound solvent including an alkanol amine, about 10 to 80% by weight of a glycol group solvent, about 9.5 to 80% by weight of a polar solvent, and about 0.5 to 10% by weight of a corrosion inhibitor.

5 Claims, 5 Drawing Sheets

COMPOSITION AND METHOD FOR REMOVING COPPER-COMPATIBLE RESIST

The present invention claims the benefit of the Korean Patent Application No. 2003-059628, filed in Korea on Aug. 27, 2003 and Korean Patent Application No. 2003-064547, filed in Korea on Sep. 17, 2003, which are hereby incorporated by reference.

BACKGROUND OF THE INVENTION

1. Field of the Invention

The present invention relates to composition and method for removing copper (Cu)-compatible resist, and more particularly, to composition and method for removing copper-compatible resist without the occurrence of corrosion.

2. Discussion of the Related Art

In general, a low resistance copper line is commonly utilized as an array line of an array substrate for a liquid crystal display (LCD) device, or as a circuit line of a semiconductor device to prevent resistance-capacitance (RC) delay. The copper line is usually formed through a photolithographic process incorporating fine pattern technology. The photolithographic process is well-known for fabricating semiconductor devices such as large scale integrated (LSI) circuits, very large scale integrated (VLSI) circuits, and display devices including LCD devices and plasma panel display (PDP) devices.

The LCD device makes use of optical anisotropy and polarization properties of liquid crystal molecules. The liquid crystal molecules have definite orientation alignment that results from their long thin shapes. The orientation of the liquid crystal molecules can be controlled by applying an electric field to the liquid crystal molecules. Accordingly, when an intensity of the applied electric field changes, the orientation of the liquid crystal molecules also changes. Since incident light through a liquid crystal material is refracted due to an orientation of the liquid crystal molecules resulting from the optical anisotropy of the aligned liquid crystal molecules, an intensity of the incident light can be controlled and images can be displayed.

Among the various types of LCD devices, active matrix LCD (AM-LCD) devices, in which thin film transistors (TFTs) and pixel electrodes connected to the TFTs are disposed in a matrix configuration, have been developed because of their high resolution and superior display of moving images.

An LCD device according to the related art is explained in detail with reference to FIGS. 1 and 2. FIG. 1 is a schematic plan view showing the related art LCD device. FIG. 2 is a schematic cross sectional view taken along a line II-II of FIG. 1.

As shown in FIGS. 1 and 2, a gate line 14 is formed on a substrate 10 along a first direction. A data line 26 crosses the gate line 14 along a second direction perpendicular to the first direction to define a pixel region P. A thin film transistor (TFT) or switching device T is located at a crossing of the gate line 14 and the data line 26 and is connected to the gate and data lines 14, 26.

A gate insulating layer 16 is formed on the gate electrode 12. A semiconductor layer 19, which is formed by subsequently depositing intrinsic amorphous silicon as an active layer 18 and impurity amorphous silicon as an ohmic contact layer 20, is deposited on the gate insulating layer 16 over the gate electrode 12. Source and drain electrodes 22, 24 are formed on the semiconductor layer 19. There is a space between the source and drain electrodes 22, 24 that form a channel exposing the portion of the active layer 18. The source electrode 22 is connected to the data line 26. The gate electrode 12, the semiconductor layer 19, and the source and drain electrodes 22, 24 constitute the TFT T.

Moreover, a passivation layer 28 is formed on the TFT T and has a drain contact hole 29 that exposes a portion of the drain electrode 24. In addition, a pixel electrode 30 is formed on the passivation layer 28 in the pixel region P and is connected to the drain electrode 24 via the drain contact hole 29. The pixel electrode 30 may be selected from one of the transparent conductive materials consisting of indium tin oxide (ITO), indium zinc oxide (IZO) and indium tin zinc oxide (ITZO).

In the multi-layered structure of the substrate 10, the metallic layers such as the gate line 14, the data line 26 and the TFT T may be selected from the metallic materials having a low resistance. In addition, the low resistance properties of the metallic materials are more typically required for large size display devices. Among them, copper is considered as a typical low resistant metallic material.

Next, an explanation of a photolithography process according to the related art will be given below. FIGS. 3A to 3C are schematic cross sectional views showing a patterning process including a photolithography process and an etching process taken along a line II-II of FIG. 1. Specifically, the patterning process is utilized for forming the gate line 14 and the gate electrode 12 or a gate pattern.

In FIG. 3A, a metal layer 11 is formed by depositing copper on the substrate 10. Next, a photoresist layer 40 is formed by coating a photoresist material on the metal layer 11. The photoresist material may be classified into a positive type in which an exposed portion of the photoresist material is removed by developing, and a negative type in which an exposed portion of photoresist material is left after developing. For example, the photoresist material in FIGS. 3A to 3C belongs to the positive type.

To perform the photolithography process, a mask M, which has a transmissive portion E and a shielding portion F, is disposed over the photoresist layer 40. At this time, the portion of the photoresist layer 40, which corresponds to the shielding portion F of the mask M, is a photoresist pattern.

Next, an actinic radiation, which is a specific radiation capable of inducing a chemical reaction, is irradiated onto the photoresist layer 40 over the substrate 10 through the mask M. In fact, the actinic radiation is irradiated onto the portion of the photoresist layer 40 corresponding to the transmissive portion E of the mask M. Specifically, the actinic radiation may be selected from high energy radiations such as ultra violet rays, electron beam, X-rays, or the like. In the step of exposing, the actinic radiation reaches the photoresist layer 40 through the transmissive portion E of the mask M to change the properties of the photoresist layer 40.

After the step of exposing, the photoresist layer 40 has a first portion EE with changed properties of the matter and a second portion FF with unchanged properties of the matter. In other words, the first and second portions EE and FF of the photoresist layer 40 correspond to the transmissive and shielding portions E and F of the mask M, respectively. Since the first and second portions EE and FF of the photoresist layer 40 are determined by the patterns of the mask M such as the transmissive and shielding portions E and F, they may be called a potential phase for the mask M. When the step of exposing is completed, a step of developing for pattering the photoresist layer 40 is performed as follows.

Referring to FIG. 3B, the second portion FF of the photoresist layer 40 of FIG. 3A is patterned into a photoresist pattern 42 through developing. The photoresist pattern 42 corresponds to the shielding portion FF of the mask M of FIG. 3A. Therefore, the portion of the metal layer 11 is exposed except for the portion covered by the photoresist pattern 42.

Next, as shown in FIG. 3C, in order to form a metal pattern, the exposed portion of the metal layer 11 is etched utilizing the photoresist pattern 42 as etching barrier means. Specifically, the metal pattern may be utilized as the gate line 14 and the gate electrode 12 as shown in FIG. 1. Although not shown, a step of removing the photoresist pattern 42 by utilizing a stripping agent is performed after the step of patterning the metal layer.

The above-discussed photolithography process is an essential process to form the metal line and electrode for the array substrate of the LCD device. These metal line and electrode are properly selected from low resistant metallic materials in light of signal applying speed of them. Recently, copper has been regarded as the typical low resistant metallic material.

However, the use of copper in this regard has some disadvantages in that, for example, an oxidation reaction is caused by exposure of the copper line to room temperature. Moreover, when copper of about 99.9999% is exposed to room temperature, it may be easily oxidized. Further, the oxidized copper line may easily be corroded by a stripping agent for removing the photoresist pattern. Because of these oxidation and corrosion issues, the corrosion of the copper line may occur relatively fast. Moreover, the copper line is also easily corroded by conventional solvents that are utilized to remove the resist pattern during the photolithographic process. Accordingly, solvent compositions that include a corrosion inhibitor for preventing corrosion of copper should be utilized, as demonstrated in U.S. Pat. Nos. 5,417,877 and 5,556,482, which are hereby incorporated by reference. Examples of possible corrosion inhibitors include mono-ethanol-amine (MEA) as a preferred amine. A specific amount of corrosion inhibitor is required so that removing properties of the inhibitor can be ensured without degradation. Generally, the basic elements of the composition for removing a copper-compatible resist include an amine compound solvent, a polar solvent and a glycol group solvent.

FIG. 4 is a scanning electron microscopy (SEM) image showing a corrosion state of a copper line by a composition including a monoethanolamine according to the related art. As shown in FIG. 4, the corrosion of the copper line severely occurred in case of utilizing the amine compound solvent including primary amine such as the mono-ethanol amine.

FIG. 5 is a SEM image showing a corrosion state between a copper line and a metal layer underneath the copper line in case of utilizing the stripping agent according to the related art. In FIG. 5, when the stripping agent did not contain a corrosion inhibitor, the corrosion between the copper line and the metal layer situated beneath the copper line is caused after stripping using the stripping agent.

In general, the corrosion between the copper line and the metal layer severely occurs by a galvanic phenomenon between the copper line and the metal layer in case of including about 0.1 to 3.0% by weight of water even if the corrosion of the copper line is not caused by the amine compound solvent.

SUMMARY OF THE INVENTION

Accordingly, the present invention is directed to a composition and method for removing a copper-compatible resist that substantially obviates one or more of the problems due to limitations and disadvantages of the related art.

Another object of the present invention is to provide a composition and method for removing a copper-compatible resist without corrosion of copper when the copper line is substituted for an aluminum line.

Another object of the present invention is to provide a composition and method for removing a copper-compatible resist without corrosion between the copper line and the metal layer underneath the copper line.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a composition for removing a copper-compatible resist includes about 10 to 30% by weight of an amine compound solvent, the amine compound solvent including an alkanol amine, about 10 to 80% by weight of a glycol group solvent, about 9.5 to 80% by weight of a polar solvent, and about 0.5 to 10% by weight of a corrosion inhibitor.

In another aspect, a method for removing a copper-compatible resist including combining about 10 to 30% by weight of an amine compound solvent including an alkanol amine, combining about 10 to 80% by weight of a glycol group solvent, combining about 9.5 to 80% by weight of a polar solvent, and combining about 0.5 to 10% by weight of a corrosion inhibitor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
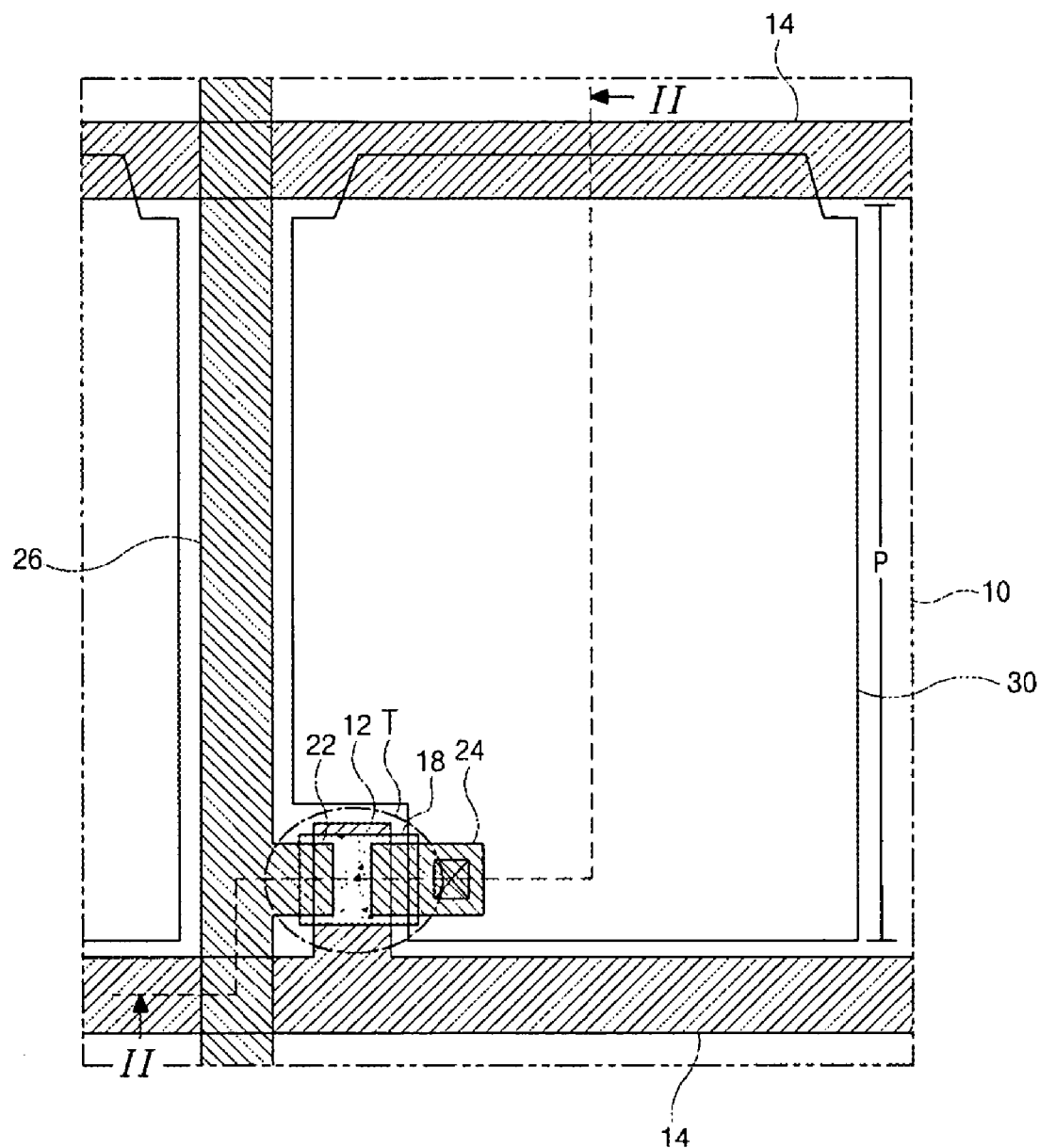
FIG. 1 is a schematic plan view showing a liquid crystal display (LCD) device according to the related art.
Figure 2:
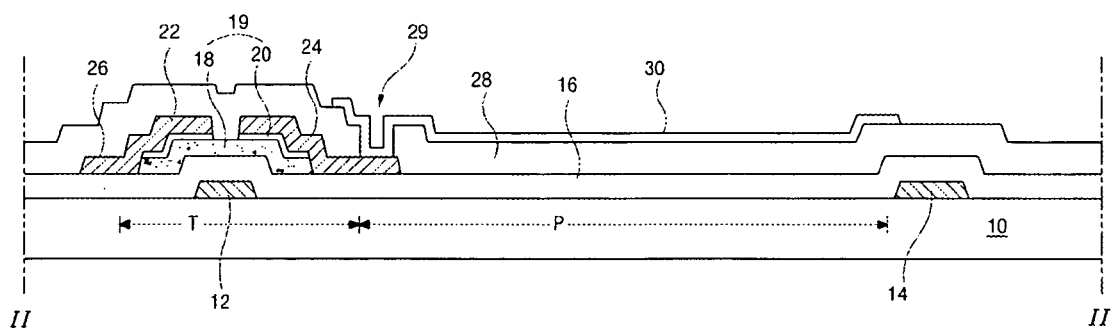
FIG. 2 is a schematic cross sectional view taken along a line II-II of FIG. 1.
Figure 3A:
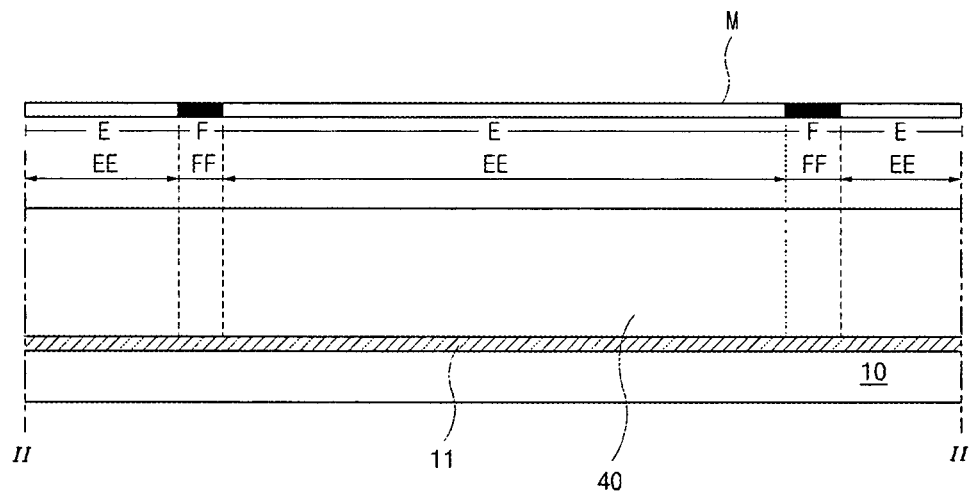
FIGS. 3A to 3C are schematic cross sectional views showing a patterning process including a photolithography process and an etching process taken along a line II-II of FIG. 1.
Figure 3B:
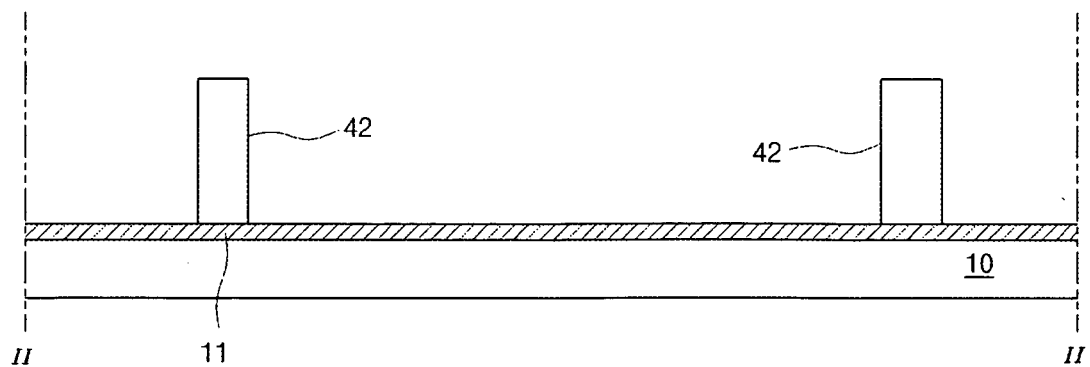
Figure 3C:
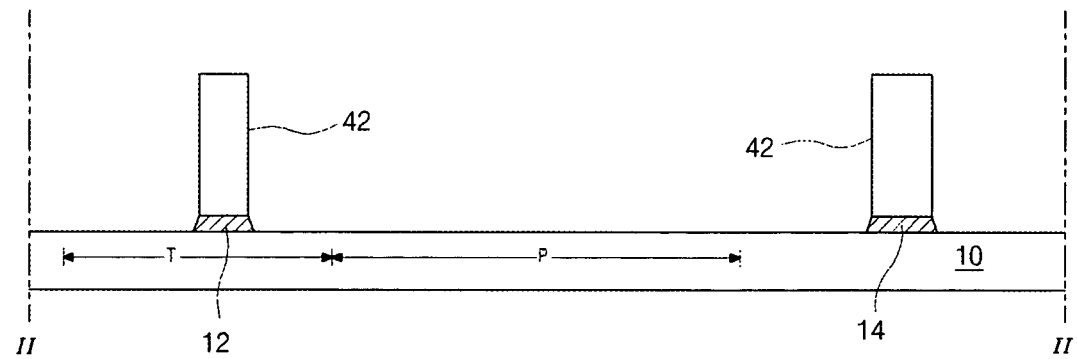
Figure 4:
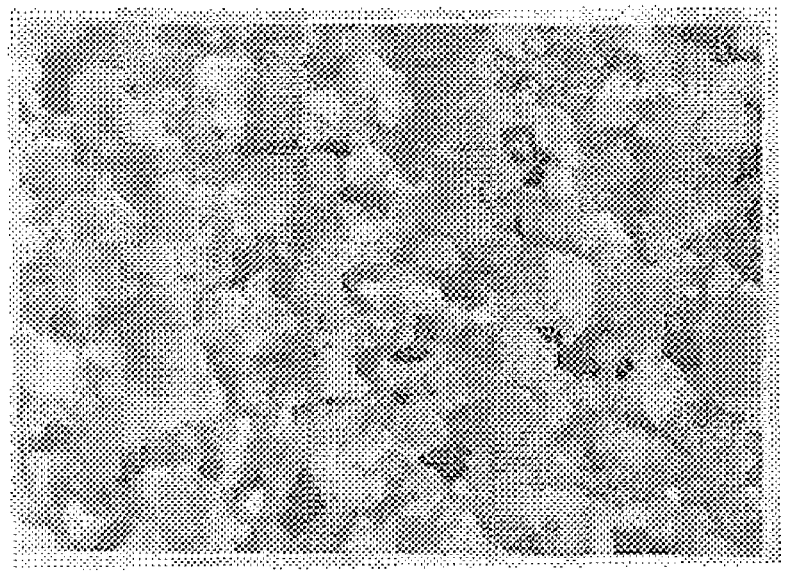
FIG. 4 is a scanning electron microscopy (SEM) image showing a corrosion state of a copper line by a composition including a monoethanolamine according to the related art.
Figure 5:
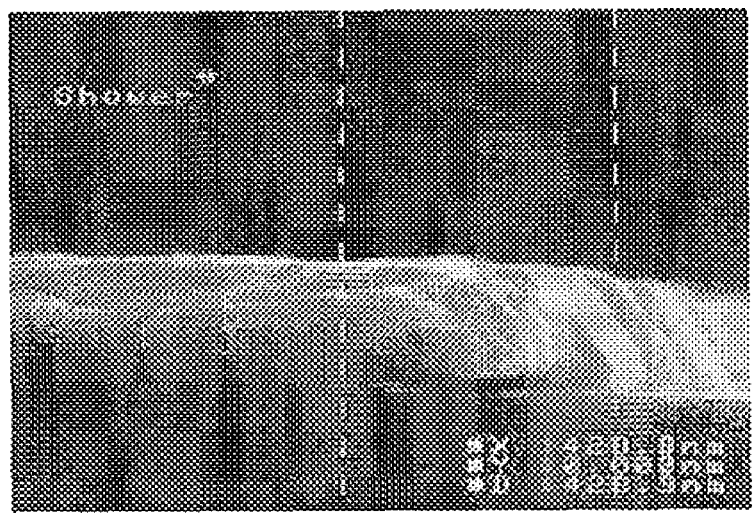
FIG. 5 is a SEM image showing a corrosion state between a copper line and a metal layer underneath the copper line in case of utilizing a stripping agent according to the related art.
Figure 6:
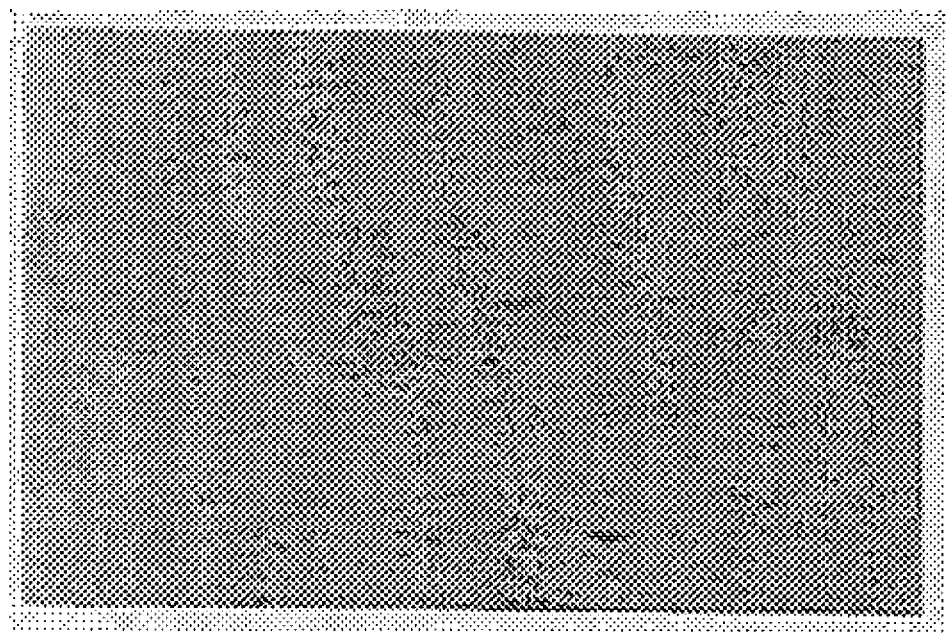
FIG. 6 is a SEM image showing a corrosion state of an exemplary copper line by a composition including a N-methylethanolamine according to an embodiment of the present invention.

FIG. 6 is a SEM image showing a corrosion state of an exemplary copper line by a composition including N-methylethanolamine according to an embodiment of the present invention. As shown in FIG. 6, when an amine compound solvent including a secondary amine such as N-methylethanol amine was utilized, the surface of the copper line becomes smooth. In other words, as shown in FIG. 6, no corrosion of the copper line occurred. Therefore, by selecting the amine compound solvent and the other solvents, the photoresist layer can be removed without the occurrence of copper line corrosion.

The composition ratio and material properties of the composition for removing a copper-compatible resist according to the present invention will be described in detail hereinafter. The composition for removing a copper-compatible resist according to embodiments of the present invention will be referred as a stripping composition for convenience sake.

(I) Amine Compound Solvent

The amine compound solvent having alkanol amine as a basic material is a strong alkali material and may penetrate into a polymer matrix of a resist that may have been transformed or bridged through a wet or dry etching process or by an ion implantation process, for example. Further, the amine compound solvent may form an empty space in the fragile structure part of the photoresist and easily remove the photoresist from a substrate by changing the photoresist into a formless gel agglomerate state.

At this time, when the amine compound solvent includes the amine having alkyl group connecting to nitrogen (—N) such as secondary amine, the amine compound solvent can reduce corrosion of the copper line. Therefore, the secondary amine is better than tertiary amine in order to improve activity of unshared electron pair for nitrogen (—N—).

The classification standard of the amine compound solvent is shown in TABLE 1.

TABLE 1

| | classification of amine | formula | PH (at 25% in aq. sol'n) |
|---|---|---|---|
| monoethanolamine | primary | 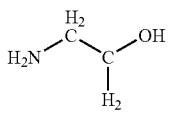 | 13.04 |
| monoisopropanolamine | primary | 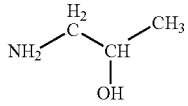 | 12.98 |
| N-methylethanolamine | secondary | 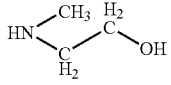 | 13.11 |
| dimethylethanolamine | tertiary | 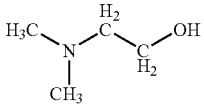 | 12.77 |
| diethylethanolamine | tertiary | 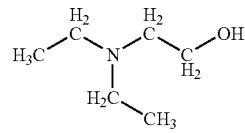 | 13.00 |

In general, the corrosion of copper by the amine compound may be independent of the basicity. As shown in TABLE 1, the copper may be corroded only by the amine, wherein two hydrogen atoms attached to nitrogen atoms of alkanol (alkyl alcohol) are not substituted. In other words, the primary amine has two non-substituents, and therefore, the corrosion occurs by utilizing the primary amine in comparison with the other amine such as the secondary amine or the tertiary amine. Especially, the corrosion may become severe when the amine ratio of the amine compound is higher than about 30%. Furthermore, since the amine is easily evaporated at temperatures above about 70° C., the amine ratio may not be controllable. Thus, the amine ratio may be preferably within a range of about 10% to about 30% by weight.

The amine compound having the alkanol amine as a basic material according to the present invention is selected from at least one of the group of N-methylethanolamine, N-ethylethanolamine, diethylethanolamine and dimethylethanolamine. Preferably, the amine compound solvent having the alkanol amine as the basic material may be properly selected from N-methylethanolamine.

(II) Glycol Group Solvent

The glycol group solvent has a close relationship with the material properties of the amine compound solvent because the activity of the glycol group solvent corresponds to activity of the amine compound solvent. In other words, when the activity of the glycol group solvent goes down, that of the amine compound solvent may go down together in the same stripping composition. For example, the secondary amine is most preferable of the amine groups in the stripping composition in light of the activity of the glycol group solvent. In addition, a simple alkylene glycol group material such as the glycolic material without ether linkage can prevent the copper line from corrosion by adding the corrosion inhibitor. For example, it is preferable that the glycol group solvent includes a glycolic solvent and a glycol ethers solvent.

The glycol group solvent has boiling points of higher than about 180° C. and may be easily mixed with water. Accordingly, even when the resist is removed during a high temperature process, a composition ratio of the glycol group solvent may be constant because of the high boiling point of the glycol group solvent. Thus, a removal rate of the copper-compatible resist may be made constant throughout the dissolving process. In addition, since the glycol group solvent has a boiling point of higher than about 180° C., a surface tension between the resist and the copper line may be reduced. Therefore, resist removal efficiency can be improved. Moreover, since the glycol group solvent has a low freezing point and a high ignition point, the glycol group solvent is safe for storage.

The stripping compound according to the present invention includes the glycol group solvent of about 10 to 80% by weight. The glycol group solvent is selected from at least one of the group of ethyleneglycol-methylether, ethyleneglycol-ethylether, ethyleneglycol-buthylether, diethyleneglycol-methylether, diethyleneglycol-ethylether, diethyleneglycol-propylether, diethyleneglycol-butylether, ethyleneglycol, diethyleneglycol, tri-ethyleneglycol, and tetra-etyleneglycol.

(III) Polar Solvent

Polar solvents dissolve polymer clusters of a gel state, which are transformed by an amine compound, into unit molecules. In the meantime, a defect caused by, for example, readhesion of photosensitive materials typically occurs during a cleaning process. The polar solvent can minimize the defect. The polar solvent such as N-methyl-2-pyrrolidone supports an ability of removing the photosensitive materials by percolating through the photosensitive materials. The polar solvent according to the present invention may be selected from at least one of the group consisting of N-methyl-2-pyrrolidone, N, N-dimethylacetamide, N,N-dimethylformamide, and N,N-dimethylimidazol.

However, N-methyl-2-pyrrolidinone has a low initial dissolution speed. Accordingly, since N-methyl-2-pyrrolidinone has a tremendous solubility to photosensitive materials, the dissolved photosensitive material may not be educed. Conversely, polar solvents such as N,N-dimethylacetamide have a high initial dissolution speed, whereby dissolved photosensitive materials may be educed over a period of time and a possibility of re-adhesion increases.

(IV) Corrosion Inhibitor

The corrosion inhibitor affects the reaction that an oxidation layer is formed on the surface of a metal layer (for example, copper or aluminum). In addition, the corrosion inhibitor in the stripping composition remains on the surface of the metal layer as the metal complex material by reacting with the oxidized metal layer. Therefore, the metal complex material by the corrosion inhibitor forms an electric and physical barrier layer on the surface of the copper line, and the corrosion inhibitor prevents the copper line from both the corrosion and a galvanic phenomenon.

The corrosion inhibitor may be selected from the material groups having unshared electron pairs such as a triazole group (—N—), a mercapto group (—S—) and an anti-oxidant group (—O—), which are effective in preventing the corrosion of copper. Especially, since the mercapto group has a good chemical and physical adsorption ability, it is particularly effective at blocking the corrosion. Moreover, the mercapto group includes —SH-group and a benzenethiol group, and has a structure such that the-SH-group is connected to a benzene ring. The benzenethiol group is more preferable in the corrosion prevention than the other mercapto group materials. This benzenethiol group forms a physical mono-molecule layer on the copper surface and is well chemically adsorbed to copper, and therefore it can efficiently prevent a metal surface of the copper line or the like from electric chemical reaction. However, the compound having this —SH-group may experience an oxidation reaction by itself at the high temperature and form a disulfide compound, and for this reason, it should be carefully chosen. For example, an organic compound that can reduce the disulfide compound to the mercapto group again includes triphenylsulfide, or the like.

The stripping composition according to the present invention includes the corrosion inhibitor of about 0.5 to 10% by weight. The corrosion inhibitor may be selected from at least one group of groups of triazole group, mercapto group and anti-oxidant group. The triazole group includes, for example, tolytriazole, benzotriazole, aminotriazole and carboxylbenzotriazole, the mercapto group includes mercaptobenzodiazole, mercaptoethanol and mercaptopropanediol, and the anti-oxidant group includes succinic acid, benzoic acid and citric acid.

The mercapto group further includes dimethylthiophenol, propylthiophenol, methoxythiophenol, methylthiophenol, thioanisole, tert-butylthiophenol, tert-buthyl-2-methylthiophenol, mercaptomethylimidazole, and mercaptomethylbenzimidazole. This mercapto group material has an effect preventing a galvanic phenomenon between Cu line and the metal line underneath of the Cu line.

In general, the stripping composition may be briefly summarized as follows:

(I) Amine Compound Solvent

The stripping composition includes about 10 to 30% by weight of amine compound solvent having the alkanol amine as a basic material.

(II) Glycol Group Solvent

The stripping compound includes about 10 to 80% by weight of glycol group solvent. The glycol group solvent may be selected from one of a glycolic solvent and a glycol ethers solvent.

(III) Polar Solvent

The stripping compound includes about 9.5 to 80% by weight of polar solvent.

(IV) Corrosion Inhibitor

The stripping compound includes about 0.5 to 10% by weight of corrosion inhibitor. The corrosion inhibitor is selected from at least one group of triazole group, mercapto group and anti-oxidant group.

Next, exemplary processes to obtain the above-mentioned stripping composition will be explained in detail. EXAMPLEs 1 and 2 choose the amine compound solvent and the glycol group solvent as the stripping compositions. One and the other specimens or example objects for the EXAMPLEs 1 and 2 tested corrosion degrees of a copper line utilizing the stripping compositions, respectively. For example, the process of forming the one specimen included coating an approximately 2000 Å copper line on a first substrate which might include a transparent insulating panel such as a glass panel, coating a photoresist material on the copper line, exposing the photoresist material utilizing a photo mask and developing the exposed photoresist material to form a photoresist pattern. In other words, when the step of developing is completed, the first substrate having the photoresist pattern was utilized as the one specimen.

In addition, the other specimen tested the removal ability for the photoresist layer utilizing the chosen stripping composition. For example, the process of forming the other specimen included coating a chromium material on a second substrate which may be selected from the same transparent insulating panel as the first substrate, coating the photoresist material, exposing the photoresist material utilizing the photo mask, developing the exposed photoresist material to form the photoresist layer, and wet-etching the portion of chromium material utilizing the photoresist layer as a shielding mask.

The chromium material has much strong adhesion with the photoresist layer in comparison with the other metallic materials. Moreover, since the photoresist layer for the chromium material is transformed during the etching step, it is seldom removed. Therefore, the other specimen could be utilized as the preferable specimen for test about the removal ability of the chosen stripping composition.

EXAMPLE 1

TABLE 2 shows the results of the removal ability of stripping compositions and corrosion degrees of a copper line and each of the results comes from stripping compositions different from each other. At this time, each of the stripping compositions consisted of a single solvent.

TABLE 2

| | copper corrosion immersion at 70° C. for 20 min | photoresist removal immersion at 70° C. for 1 min |
|---|---|---|
| monoethanolamine | entire corrsion | complete removal 10 |
| N-methylethanolamine | entire corrsion | complete removal 10 |
| N-methyl-2-pyrrolidone | no corrosion | no removal 0 |
| N,N-dimethylacetamide | no corrosion | partial leave 5 |
| diethyleneglycolethylether | no corrosion | partial leave 5 |
| diethyleneglycolbuthylether | no corrosion | partial leave 5 |
| tetraethyleneglycol | uniform pit | partial leave 5 |

※ 0 (no removal)→ 10 (complete removal)

As shown in TABLE 2, when the stripping compositions did not contain a corrosion inhibitor and each of the stripping compositions was only selected from one of the amine compound solvent and the glycol group solvents, the corrosion on an entire surface of the copper line or pitting on the copper line was detected. In this EXAMPLE 1, the amine compound solvent was selected from one of mono-ethanolamine, N-methylethanolamine, and the glycol group solvent consisted of tri-ethyleneglycol. Therefore, since a single amine compound solvent can not be utilized as the stripping agent, it is preferable that the single amine compound solvent is utilized as the stripping agent by combining the glycol group solvent and polar solvent explained above with a proper composition ratio.

EXAMPLE 2

TABLE 3 shows corrosion degrees of the copper lines which depend on the kinds of the applied amine compound solvents.

TABLE 3

| | copper corrosion immersion at 70° C. for 400 sec. |
|---|---|
| monoethanolamine | 0 |
| monoisopropanolamine | 3 |
| N-methylethanolamine | 10 |
| dimetylethanolamine | 10 |
| diethylethanolamine | 10 |

※ 0 (complete corrosion) → 10 (no corrosion)

The TABLE 3 shows the result utilizing a diluted solution that was formed by mixing the single amine compound solvent, 45% by weight of glycol ethers solvent and 45% by weight of polar solvent. At this time, since the stripping agent shown in TABLE 2 consisting of the single compound can not prevent the corrosion of the copper line, the stripping composition shown in TABLE 3 consisted of the glycol ethers solvent, the polar solvent and amine compound solvent. At this time, the glycol ethers solvent and the polar solvent did not cause corrosion of the copper line.

As shown in TABLE 3, in case of utilizing N-methylethanolamine, diethylethanolamine and dimethylethanolamine as one of elements of the stripping composition, corrosion of the copper line did never occur. Therefore, the amine compound solvent according to an embodiment of the present invention includes alkanol amine as a basic material referring to the result of the EXAMPLE 2.

EXAMPLES 3 AND 4 tested the removal ability of stripping composition and corrosion force of the copper line for the stripping compositions. In addition, specimens or example objects, for the EXAMPLES 3 AND 4 included third to sixth specimens, as follows:

(I) First Specimen for the Example 3

The first specimen was manufactured by the process including sequentially depositing an intrinsic amorphous silicon (a-Si:H) and impurity doped amorphous silicon (n+a-Si:H) on a substrate to form a semiconductor layer having the active layer and the ohmic contact layer, and dry-etching the semiconductor layer by utilizing the photoresist layer as a shielding means, and removing the photoresist layer. The size of the first specimen was 1□×4□.

(II) Second specimen for the Example 3

The second specimen was prepared by forming a chromium (Cr) layer on a glass substrate, wet-etching, treating with a dry etching gas, and removing a resist on the chromium layer. The size of the second specimen was also 1□×4□. For reference, the chromium layer is commonly utilized as source and drain electrode for an LCD device according to the related art. Although it is hardly corroded by the stripping agent, it is usable for the estimation of the removal ability of the stripping agent.

(III) Third Specimen for the Example 3

The third specimen was manufactured by a process including coating a photoresist layer (DTFR-3650B: Dong-Jin semichem company production and a positive type photoresist material) on a substrate, baking the photoresist layer at about 170° for about 25 minutes and removing the baked photoresist. The size of the third specimen was also 2□×4□.

(IV) Fourth specimen for the Example 4

The fourth specimen has double metal layers including a first metal layer as a bottom layer and a second metal layer as a top layer. The second metal layer was a copper line and the first metal layer was selected from the metal having a substantial electric potential difference of oxidation and reduction for the copper line. In addition, the fourth specimen was manufactured by wet-etching the double layer. The size of the fourth specimen was also 2□×4□.

As shown in TABLE 4 as below, tests for the EXAMPLES 3 and 4 are performed on the first to third specimens utilizing 22 kinds of stripping compositions.

EXAMPLE 3

TABLE 5 shows a tested result for the removal ability of the surface quality of the first to third specimens. In the EXAMPLE 3, the stripping composition was boiled at about 70° and the first to third specimens were immersed. Next, the first and second specimens were observed by a scanning electron microscope, and the third specimen was observed with the naked eye.

TABLE 5

| No. | immersion for 200 sec. (1st specimen) | immersion for 60 sec. (2nd specimen) | immersion for 50 sec. (3rd specimen) |
|---|---|---|---|
| sample 1 | 10 | 10 | 7 |
| sample 2 | 10 | 10 | 8 |
| sample 3 | 10 | 10 | 8 |
| sample 4 | 10 | 10 | 7 |
| sample 5 | 10 | 10 | 8 |
| sample 6 | 10 | 10 | 8 |
| sample 7 | 10 | 10 | 10 |
| sample 8 | 10 | 10 | 10 |
| sample 9 | 10 | 10 | 10 |

TABLE 4 component of stripping composition

| NO. | amine compound solvent Kind | content (wt %) | glycol etheres solvent Kind | content (wt %) | polar solvent Kind | content (wt %) | 1st additive Kind | content (wt %) |
|---|---|---|---|---|---|---|---|---|
| sample 1 | NMEA | 10 | DEGEE | 80 | NMP | 10 | TT | 0.5 |
| sample 2 | NMEA | 10 | DEGEE | 60 | NMP | 30 | TT | 0.5 |
| sample 3 | NMEA | 10 | DEGEE | 40 | NMP | 50 | TT | 0.5 |
| sample 4 | NMEA | 10 | DEGBE | 80 | NMP | 10 | TT | 0.5 |
| sample 5 | NMEA | 10 | DEGBE | 60 | NMP | 30 | TT | 0.5 |
| sample 6 | NMEA | 10 | DEGBE | 40 | NMP | 50 | TT | 0.5 |
| sample 7 | NMEA | 20 | DEGEE | 50 | NMP | 30 | TT | 0.5 |
| sample 8 | NMEA | 20 | DEGBE | 50 | NMP | 30 | TT | 0.5 |
| sample 9 | NMEA | 30 | DEGEE | 40 | NMP | 30 | TT | 0.5 |
| sample 10 | NMEA | 30 | DEGBE | 40 | NMP | 30 | TT | 0.5 |
| sample 11 | NMEA | 10 | DEGEE | 60 | NMP | 30 | CBT | 0.5 |
| sample 12 | NMEA | 10 | TEG | 55 | NMP | 30 | TT | 5 |
| sample 13 | NMEA | 10 | TEG | 55 | NMP | 30 | Succinic aicd | 2 |
| comparative sample 1 | MEA | 10 | DEGEE | 60 | NMP | 30 | | |
| comparative sample 2 | NMEA | 10 | DEGEE | 60 | DMAc | 30 | | |
| comparative sample 3 | NMEA | 10 | TEG | 60 | NMP | 30 | | |
| comparative sample 4 | MEA | 10 | DEGEE | 60 | NMP | 30 | TT | 0.5 |
| comparative sample 5 | NMEA | 10 | DEGEE | 60 | NMP | 30 | BT | 0.5 |
| comparative sample 6 | NMEA | 10 | DEGEE | 60 | NMP | 30 | 8-HQ | 0.5 |
| comparative sample 7 | NMEA | 10 | DEGEE | 60 | NMP | 30 | MBT | 0.5 |
| comparative sample 8 | NMEA | 10 | DEGEE | 60 | NMP | 30 | succinic acid | 0.5 |
| comparative sample 9 | NMEA | 10 | DEGEE | 90 | | | TT | 0.5 |

(NMEA: N-methylethanolamine, DEGEE: diethyleneglycol-butylether, DEGBE: diethyleneglycol-butylether, TEG: tri-ethyleneglycol, NMP: N-methyle-2-pyrrolidone, DMAc: N,N-dietylacetamide, BT: benzotriazole, 8-HQ: 8-hydroxyquinoline, TT: tolytriazole, CBT: carboxylbenzotriazole, MBT: mercaptobenzodiazole)

TABLE 5-continued

| No. | immersion for 200 sec. (1st specimen) | immersion for 60 sec. (2nd specimen) | immersion for 50 sec. (3rd specimen) |
|---|---|---|---|
| sample 10 | 10 | 10 | 10 |
| sample 11 | 10 | 10 | 7 |
| sample 12 | 10 | 9 | 6 |
| sample 13 | 10 | 9 | 5 |
| comparative sample 1 | 10 | 10 | 7 |
| comparative sample 2 | 10 | 10 | 7 |
| comparative sample 3 | 10 | 10 | 6 |
| comparative sample 4 | 10 | 10 | 8 |
| comparative sample 5 | 10 | 10 | 8 |
| comparative sample 6 | 10 | 10 | 7 |
| comparative sample 7 | 10 | 10 | 7 |
| comparative sample 8 | 10 | 10 | 7 |
| comparative sample 9 | 10 | 10 | 1 |

※ 0 (no removal) → 10 (complete removal)

As shown in TABLE 5, it should be noted that the more the amine compound solvent was added in the stripping composition, the higher the removal ability was than before. However, in case of excluding the polar solvent such as a comparative sample 9, the photoresist layer was hardly removed during the immersing for 50 second.

EXAMPLE 4

The EXAMPLE 4 tested corrosion of the copper line utilizing the fourth specimen.

TABLE 6

| | immersion for 400 sec. (4th specimen) |
|---|---|
| sample 1 | 10 |
| sample 2 | 10 |
| sample 3 | 10 |
| sample 4 | 10 |
| sample 5 | 10 |
| sample 6 | 10 |
| sample 7 | 10 |
| sample 8 | 10 |
| sample 9 | 10 |
| sample 10 | 10 |
| sample 11 | 10 |
| sample 12 | 10 |
| sample 13 | 8 (weak pitting) |
| comparative sample 1 | 2 |
| comparative sample 2 | 2 |
| comparative sample 3 | 3 (hard pitting) |
| comparative sample 4 | 7 (weak pitting) |
| comparative sample 5 | 5 |
| comparative sample 6 | 5 (hard pitting) |
| comparative sample 7 | 7 |
| comparative sample 8 | 3 |
| comparative sample 9 | 10 |

※ 0 (complete corrosion) → 10 (no corrosion)

As shown in first to thirteenth samples of the TABLE 6, tolytriazole, carboxylbenzotriazole and succinic acid, and so on were exhibited as corrosion inhibitors. In the TABLE 6, as shown in sample 8, in case of the succinic acid, when the stripping composition contained the glycol ethers solvent, the succinic acid could not show its function. Therefore, the succinic acid could only show its function for the glycol group solvent excluding the glycolic etheres solvent. Meanwhile, when the stripping compositions did not contain the corrosion inhibitor as the first to third samples, the corrosion phenomenon of the copper line became exacerbated. In case of the fifth comparative sample, although benzotriazole (BT), which is a similar group of tolytriazole (TT) forming a complex with the copper line, was utilized as the corrosion inhibitor due to unshared electron pair for nitrogen (—N), it was not enough for an additive such as the corrosion inhibitor.

In case of the sixth to eighteenth comparative samples, although 8-hydroxyquinoline (HQ) as the corrosion inhibitor was in the stripping composition, a pitting phenomenon occurred on the copper line. This is because the unshared electron pair for nitrogen in the stripping composition failed to form the complex with the copper line. Therefore, it should be noted that the stripping composition according to an embodiment of the present invention essentially includes the corrosion inhibitor which includes the triazole group as the main material capable of forming a complex with the copper line.

EXAMPLE 5

An EXAMPLE 5 related to an estimation with corrosion of the copper line due to absorption moisture. In general, when the solution including the secondary amine is left alone all day long, it absorbs the moisture more than about 3%. On the other hand, when the solution is heated at about 70°, it absorbs the moisture less than about 2%. That is to say, in the general LCD process, it could find that absorbing (or mixing) moisture in the solution having the amine compound solvent is a common case. However, in case of including the moisture, the amine is activated by the moisture, and therefore aminium ion and hydroxide ion are caused by the activated amine. Thus, oxidation atmosphere is naturally formed. On the other hand, because the copper line is weak in the oxidation atmosphere, it adsorbs the moisture and is easily corroded in a condition such as a high temperature. Moreover, when the stripping composition never contains the corrosion inhibitor, the corrosion phenomenon is exacerbated. Therefore, the copper line might be entirely removed from the substrate because the entire surface of the copper line is corroded. That is to say, the EXAMPLE 5 illustrates an example to examine a stripping composition that is able to prevent the corrosion of the copper line even in an atmosphere in which the copper line is oxidized.

Hereinafter, all of the samples of TABLE 7 tested by adding about 3% by weight of ultra pure water at will.

TABLE 7

| | immersion for 30 sec. (4th specimen) |
|---|---|
| sample 1 | 10 |
| sample 2 | 10 |
| sample 3 | 10 |
| sample 4 | 10 |
| sample 5 | 10 |
| sample 6 | 10 |
| sample 7 | 10 |
| sample 8 | 10 |
| sample 9 | 10 |
| sample 10 | 10 |
| sample 11 | 10 |
| sample 12 | 10 |
| sample 13 | 10 |
| comparative sample 1 | 0 |
| comparative sample 2 | 0 |
| comparative sample 3 | 0 |
| comparative sample 4 | 5 (hard pitting) |

TABLE 7-continued

| | immersion for 30 sec. (4th specimen) |
|---|---|
| comparative sample 5 | 5 |
| comparative sample 6 | 2 (hard pitting) |
| comparative sample 7 | 7 |
| comparative sample 8 | 0 |
| comparative sample 9 | 10 |

※ 0 (complete corrosion) → 10 (no corrosion)

As shown in TABLE 7, corrosion of the copper line is tested to prevent copper from absorbing the moisture, by adding a corrosion inhibitor such as the triazole group, mercapto group and anti-oxidant group material. At this time, the triazole group includes tolytriazole, benzotriazole, aminotriazole and carboxylbenzotriazole. In addition, the mercapto group includes mercaptobenzodiazole, mercaptoethanol and mercaptopropanediol.

As shown in sample 1 to 13 of the TABLE 7, the corrosion inhibitor includes tolytriazole, carboxylbenzotriazole and succinic acid, and so on. On the other hand, as shown in comparative sample 8 of the table 7, in case of the succinic acid, when the stripping composition contains the glycol ethers solvent, the succinic acid can not show its function. Therefore, the succinic acid can only show its function for the glycol group solvent excluding the glycolic etheres solvent. Meanwhile, in the comparative samples 1 to 3 which the stripping composition does not contain the corrosion inhibitor, in case of mixing the moisture, the copper line was completely corroded. In addition, in the comparative sample 5, although benzotriazole (BT), which is a similar group of tolytriazole (TT) forming a complex with the copper line, is utilized as the corrosion inhibitor due to unshared electron pair for nitrogen (—N), it is not enough for an additive such as the corrosion inhibitor.

In case of the comparative samples 6 to 8, although 8-hydroxyquinoline (HQ) as the corrosion inhibitor was added in the stripping composition, pitting phenomenon still occurred on the copper line. This is because the unshared electron pair for nitrogen in the stripping composition failed to form the complex with the copper line.

The corrosion inhibitor affects the reaction that oxidation layer is formed on the surface of a metal layer (copper, aluminum or the like). In addition, the corrosion inhibitor in the stripping composition remains on the surface of the metal layer as the metal complex material by reacting with the oxidized metal layer. Therefore, the metal complex material by the corrosion inhibitor forms an electric or physical barrier layer on the surface of the copper line, and the corrosion inhibitor prevents the copper line from the corrosion and the galvanic phenomenon.

EXAMPLE 6

This EXAMPLE 6 is performed utilizing the stripping compositions manufactured in sixteenth conditions as below shown in TABLE 8 in order to test the removal ability for photoresists and the corrosion force of a copper line

TABLE 8

| | component of stripping composition | | | | | | | | |
|---|---|---|---|---|---|---|---|---|---|
| | NMEA | 2* | | NMP | 3* | | 4* | | 5* |
| NO. | 1* | | 1* | 1* | | 1* | | 1* | 1* |
| sample 14 | 10 | DEGEE | 60 | 30 | | | MTP | 0.5 | |
| sample 15 | 10 | DEGBE | 60 | 30 | | | MTP | 0.5 | |
| sample 16 | 10 | DEGEE | 60 | 30 | | | PTP | 0.5 | |
| sample 17 | 10 | DEGEE | 60 | 30 | | | MXTP | 0.5 | |
| sample 18 | 10 | DEGEE | 60 | 30 | | | TBTP | 0.5 | |
| sample 19 | 10 | DEGEE | 60 | 30 | | | TBMTP | 0.5 | |
| sample 20 | 10 | DEGEE | 60 | 30 | | | DMTP | 0.5 | |
| sample 21 | 10 | DEGEE | 60 | 30 | | | MMI | 0.5 | |
| sample 22 | 10 | DEGEE | 60 | 30 | | | MMI | 0.5 | SA 0.5 |
| sample 23 | 10 | DEGBE | 60 | 30 | | | MMI | 0.5 | SA 0.5 |
| sample 24 | 10 | DEGBE | 60 | | EG | 30 | MMI | 0.5 | |
| sample 25 | 10 | DEGBE | 60 | 20 | EG | 10 | MMB | 0.5 | |
| comparative sample 10 | 10 | DEGEE | 85 | | | | MTP | 0.5 | TPP 5 |
| comparative sample 11 | 10 | DEGEE | 90 | | | | MSA | 0.5 | |
| comparative sample 12 | 10 | DEGEE | 60 | 30 | | | TDS | 0.5 | |
| comparative sample 13 | 10 | DEGEE | 60 | 30 | | | TT | 0.5 | |

(nMEA: n-methylethanolamine, TDS: tolydisulfide, DEGEE: diethyleneglycol-ethylether, MXTP: methoxythiophenol, DEGBE: diethyleneglycol-butylether, PTP: propylthiophenol, NMP: n-methyl-2-pyrrolidone, TT: tolytriazole, EG: ethylene glycol, TEG: tri-ethylene glycol, MTP: methylthiophenol, DMTP: dimethylthiophenol, TBTP: tert-butylthiophenol, TBMTP: tert-butyl,2-methylthiophenol, BA: benzoic acid, SA: succinic acid, TPP: triphenolphosphine, MMI: mercaptomethylimidazole, MMB: mercaptomethylbenzimidazole, MSA: mercapto succinic acid, 1* - content (wt %), 2* - glycol ethers solvent, 3* - glycolic solvent, 4* - 2nd additive, 5* - 3rd additive)

EXAMPLE 7

Hereinafter, TABLE 9 is a test result of the removal ability about the film quality of the mentioned first to third specimens. Specifically, first and second specimens are observed by a scanning electron microscope, and the third specimen are observed with the naked eye after boiling the removal solution at 70° and immersing the first to third specimens in the removal solution, sequentially.

TABLE 9

| | 200 sec. immersion (1st specimen) | 60 sec. immersion (2nd specimen) | 120 sec. immersion (3rd specimen) |
|---|---|---|---|
| sample 14 | 10 | 10 | 10 |
| sample 15 | 10 | 10 | 10 |
| sample 16 | 10 | 10 | 10 |
| sample 17 | 10 | 10 | 10 |
| sample 18 | 10 | 10 | 10 |
| sample 19 | 10 | 10 | 10 |
| Sample 20 | 10 | 10 | 10 |
| sample 21 | 10 | 10 | 10 |
| sample 22 | 10 | 10 | 10 |
| Sample 23 | 10 | 10 | 10 |
| Sample 24 | 10 | 10 | 10 |
| Sample 25 | 10 | 10 | 10 |
| comparative sample 10 | 10 | 10 | 10 |
| comparative sample 11 | 10 | 10 | 10 |
| comparative sample 12 | 10 | 10 | 10 |
| comparative sample 13 | 10 | 10 | 10 |

※ 0 (no removal) → 10 (complete removal)

As shown in TABLE 9, the difference between the samples is not particularly, but corrosion of the metal layer underneath the copper line is observed only in the composition of the comparative sample 13.

EXAMPLE 8

An EXAMPLE 8 tests the corrosion force of the copper line utilizing the fourth specimen.

TABLE 10

| No. | immersion for 30 min. (4th specimen) | |
|---|---|---|
| | copper | bottom metal |
| sample 14 | 10 | 10 |
| sample 15 | 10 | 10 |
| sample 16 | 10 | 10 |
| sample 17 | 10 | 10 |
| sample 18 | 10 | 10 |
| sample 19 | 10 | 10 |
| Sample 20 | 10 | 10 |
| sample 21 | 9 | 10 |
| sample 22 | 10 | 10 |
| Sample 23 | 10 | 10 |
| Sample 24 | 10 | 10 |
| Sample 25 | 10 | 10 |
| comparative sample 10 | 10 | 10 |
| comparative sample 11 | 7 | 10 |
| comparative sample 12 | 2 | 2 |
| comparative sample 13 | 10 | 2 |

※ 0 (complete corrosion) → 10 (no corrosion)

As shown in TABLE 10, the corrosion due to the galvanic phenomenon between the copper line and a metal layer underneath the copper line never occurred in the samples 14 to 25. However, in the corrosion inhibitors consisting of the mercapto group, limited kinds of the corrosion inhibitors have an effect of blocking the galvanic phenomenon.

The stripping composition according to the comparative sample 10 utilizes methylthiophenol as the corrosion inhibitor and never caused corrosion between the copper line and the metal layer underneath the copper line. However, in case of utilizing methylthiophenol as a single corrosion inhibitor such as the EXAMPLEs 14 and 15, triphenylphosphine was utilized to block the phenomenon that the removal ability of the corrosion inhibitor becomes weak as time going by resulting from the methylthiophenol being dissolved at high temperature. However, when the stripping composition was mixed with water such as the comparative sample 10, the triphenylphosphine was deposited and absorbed on the surface of the copper line. Therefore, a serious defect was caused by the absorbing.

Although the mercapto group corrosion inhibitor is the same group material, it is detected that the mercapto group corrosion inhibitor shown in the comparative samples 11 and 12 could not block the galvanic phenomenon. Therefore, it was determined that the metal layer underneath the copper line according to the comparative samples 11 and 12 was corroded.

Hereinafter, an EXAMPLE 9 is an estimation about corrosion of the copper line due to absorption moisture. For convenience, the overlapped explanation is omitted with the EXAMPLE 5. TABLE 11 shows a test conducted by adding about 3% by weight of ultra pure water at will.

TABLE 11

| No. | immersion for 30 min. | |
|---|---|---|
| | copper | bottom metal |
| sample 14 | 10 | 10 |
| sample 15 | 10 | 10 |
| sample 16 | 10 | 10 |
| sample 17 | 10 | 10 |
| sample 18 | 10 | 10 |
| sample 19 | 10 | 10 |
| Sample 20 | 10 | 10 |
| sample 21 | 9 | 10 |
| sample 22 | 10 | 10 |
| Sample 23 | 10 | 10 |
| Sample 24 | 10 | 10 |
| Sample 25 | 10 | 10 |
| comparative sample 10 | 10 | 9 |
| comparative sample 11 | 5 | 10 |
| comparative sample 12 | 0 | 2 |
| comparative sample 13 | 10 | 2 |

※ 0 (complete corrosion) → 10 (no corrosion)

As shown in TABLE 11, the triazole group corrosion inhibitors have an prevention effect in the reaction in which an oxidation layer is formed because it did a chemical adsorption with the oxidation layer by controlling movement of an electron on the surface of the copper line.

Similarly, because the mercapto group corrosion inhibitor according to the samples of the TABLE 11 is low electric potential difference of oxidation and reduction as well as the chemical absorption on the surface of the copper line, it can prevent between the copper line and the metal layer underneath the copper line from galvanic phenomenon.

The stripping composition according to an exemplary example of the present invention can provide the corrosion prevention of the copper line as well as the removal ability for the photoresist layer. Further, the stripping composition according to another exemplary example of the present invention is capable of blocking the galvanic phenomenon between the copper line and the metal layer underneath the copper line.

Accordingly, as the electrodes and lines of the electro-circuit or display devices are manufactured utilizing copper, the movement properties of these productions can be improved. Especially, in case of the display device, aperture ratio of the display device can be increased.

It will be apparent to those skilled in the art that various modifications and variations can be made in the composition and method for removing copper-compatible resist of the present invention without departing from the spirit or scope of the invention. Thus, it is intended that the present invention cover the modifications and variations of this invention provided they come within the scope of the appended claims and their equivalents.

What is claimed is:

1. A method for removing a copper-compatible resist, comprising combining about 10 to 30% by weight of an alkanol amine solvent, combining about 10 to 80% by weight of a glycol group solvent, combining about 9.5 to 80% by weight of a polar solvent, and combining about 0.5 to 10% by weight of a corrosion inhibitor, wherein the the alkanol amine solvent is selected from at least one of an alkyl group consisting of N-methylethanolamine, N-ethylethanolamine, diethylethanolamine and dimethylethanolamine, and wherein the corrosion inhibitor is selected from an mercapto group consisting of mercaptobenzodiazole, mercaptoethanol, mercaptopropanediol, dimethylthiophenol, propylthiophenol, methoxythiophenol, methylthiophenol, thioanisole, tert-butylthiophenol, tert-buthyl-2-methylthiophenol, mercaptomethylimidazole, and mercaptomethylbenzimidazole.

2. The method according to claim 1, wherein the glycol group solvent has a boiling point higher than about 180° C.

3. The method according to claim 1, wherein the glycol group solvent is selected from one of glycolic solvent and glycol ethers solvent.

4. The method according to claim 2, wherein the glycol group solvent is selected from at least one of the group consisting of ethyleneglycol-methylether, ethyleneglycol-ethylether, ethyleneglycol-buthylether, diethyleneglycol-methylether, diethyleneglycol-ethylether, diethyleneglycol-propylether, diethyleneglycol-butylether, ethyleneglycol, diethyleneglycol, tri-ethyleneglycol, and tetra-etyleneglycol.

5. The method according to claim 1, wherein the polar solvent is selected from at least one of the group consisting of N-methyl-2-pyrrolidone, N,N-dimethylacetamide, N,N-dimethylformamide, and N,N-dimethylimidazol.

* * * * *

UNITED STATES PATENT AND TRADEMARK OFFICE
CERTIFICATE OF CORRECTION

| | | |
|---|---|---|
| PATENT NO. | : 7,384,900 B2 | Page 1 of 1 |
| APPLICATION NO. | : 10/924841 | |
| DATED | : June 10, 2008 | |
| INVENTOR(S) | : Gyoo-Chul Jo | |

It is certified that error appears in the above-identified patent and that said Letters Patent is hereby corrected as shown below:

On the Title Page: Item (73) Assignee, should read:

LG Display Co., Ltd.
Dongjin Semichem, Co., Ltd.

Signed and Sealed this
Fifth Day of June, 2012

David J. Kappos
*Director of the United States Patent and Trademark Office*